United States Patent [19]

Sage

[11] 4,057,788
[45] Nov. 8, 1977

[54] SEMICONDUCTOR MEMORY STRUCTURES

[75] Inventor: Jay P. Sage, Newton Center, Mass.

[73] Assignee: Raytheon Company, Lexington, Mass.

[21] Appl. No.: 619,890

[22] Filed: Oct. 6, 1975

[30] Foreign Application Priority Data

Oct. 21, 1974 Japan .................................. 49-120265

[51] Int. Cl.² ............................................ G11C 13/00
[52] U.S. Cl. ...................................... 365/174; 357/54
[58] Field of Search ...................... 340/173 R; 357/54

[56] References Cited

U.S. PATENT DOCUMENTS

| 3,653,002 | 3/1972 | Goffee | 307/279 |
| 3,832,700 | 8/1974 | Wu | 340/173 VT |
| 3,846,768 | 11/1974 | Krick | 340/173 VT |

FOREIGN PATENT DOCUMENTS 1,297,745  11/1972  United Kingdom ............ 340/173 R Primary Examiner—Terrell W. Fears
Attorney, Agent, or Firm—M. D. Bartlett; J. D. Pannone

[57] ABSTRACT

A method of storing electric charges in a metal-nitride-oxide-semiconductor memory element by setting the threshold voltage of the element at any of a substantial number of voltages by applying both a DC voltage corresponding to the analog voltage to be stored and an AC voltage which is gradually reduced.

6 Claims, 6 Drawing Figures

SEMICONDUCTOR MEMORY STRUCTURES

BACKGROUND OF THE INVENTION

This invention relates to a storing method in a semiconductor memory device comprising an electric charge capture layer provided on a semiconductor substrate through an insulating layer, and in particular to a method of setting in an analog manner a threshold voltage of a semiconductor memory element at a predetermined value.

As this sort of semiconductor memory element, for example, an MNOS (metal-nitride-oxide-semiconductor) element, an MAOS (metal-alumina-oxide semiconductor) element, an MOMOS (metal-oxide-metal oxide-semiconductor) element, etc., are known. These elements all have an electric charge capture layer provided on a semiconductor substrate through an insulating layer. That is to say, this electric charge capture layer, for example, in the MNOS element and the MAOS element, means a layer having an electric charge capture level present in the vicinity of the interface between the nitride and the oxide and between the alumina and the oxide, respectively. In the MOMOS element, the whole metal layer sandwiched by the oxides (insulating materials) forms an electric charge capture layer.

An electric charge is injected into the above said electric charge capture layer through the insulating layer from the semiconductor substrate, and, depending upon the amount of electric charge thus injected, the threshold voltage of the semiconductor memory element is controlled. The electric charge injected cannot escape to the semiconductor substrate due to the existence of said insulating layer and is stored in the electric charge capture layer semipermanently, so that the threshold voltage can be used in a non-volatile memory.

The setting of such a threshold voltage is also called writing, and in the case where this setting value takes only two discrete values, the writing is called digital writing. To the contrary, in the case where the setting value can take any consecutive values, the writing of said threshold voltage is called analog writing.

In the case of digital writing, it suffices to store only two values, for example, "1" and "0", so that, particularly, writing accuracy, etc., is not called in question, but in the case of analog writing, it is necessary to write the setting value with high accuracy.

Now, in the case of storing a threshold voltage Vthl in a semiconductor memory element on the basis of the hysteresis curve, heretofore the writing of the threshold voltage has been carried out by applying a single pulse voltage Vg to the gate of the semiconductor memory element. However, the threshold voltage obtained by this type of writing method, in many cases, deviates from the predetermined value *VtHl*. The reason for this is not clear, but it appears to be due to the facts that the writing into the semiconductor memory element is not carried out in the stable or equilibrium state of the element, that the hysteresis curve varies completely depending upon the structure of the element in which to store, for example, the thickness of the extremely thin oxide layer, etc., in the case of an MNOS element, and so forth.

Also, even with the general semiconductor technique, it is extremely difficult to manufacture elements of absolutely the same structure, there always existing irregularities between the elements. That is to say, even if, for example, a plurality of semiconductor memory elements were manufactured on the same substrate under the same conditions, irregularities in characteristics between these elements and defectiveness could not be avoided.

As is clear even from the above explanation, in the conventional writing method there is the disadvantage that, for the accurate threshold value writing, a feedback mechanism, a circuit for generating a variable pulse corresponding to a feedback signal, a complicated calculator, etc., are always required.

Further, the inclination of the inclined portion of the hysteresis curve is sharp, so that if the pulse voltage applied changes even a bit, the threshold voltage written comes to change greatly, this being one of the major causes for the writing accuracy to lower.

From these points, the conventional method was disadvantageous in that the writing device becomes large-scaled and also becomes complicated in operation.

Also, the conventional method was limited in use and very inconvenient, since the writing pulse waveform must be changed each time according to the desired threshold voltages.

SUMMARY OF THE INVENTION

This invention, being one created in view of the above-mentioned points, provides a method capable of effecting in an analog manner the writing of any optional threshold value simply and with high accuracy, and is characterized in that a DC voltage corresponding to a threshold voltage to be set and an AC voltage at least the amplitude or pulse length of which is gradually attenuated are applied superposed one upon the other to the gate of an insulating gate type semiconductor memory device. By this invention, the setting of a threshold voltage of the semiconductor memory device can be carried out linearly over a fairly wide range.

This threshold value thus set was fully stable even as compared with the conventional non-volatile element.

In one embodiment of this invention, a semiconductor memory device having an MNOS element is prepared. The fundamental structure of this MNOS element comprises a semiconductor substrate, i.e., silicon substrate, with a silicon dioxide layer of several tens A, for example, 20A, in thickness and a silicon nitride layer of hundreds A, for example, 500A, in thickness laminated thereon, and, further, an aluminum electrode layer which serves as a gate provided thereon.

In accordance with this invention, a predetermined voltage containing two components is applied between the aluminum gate electrode layer and the silicon substrate of this MNOS element to effect writing. More specifically, the voltage to be applied is a pulse voltage containing a first component which is an AC voltage whose amplitude is gradually attenuated with the lapse of time, and a component which is a DC voltage corresponding to the threshold voltage to be written. It is a feature of this invention that the voltage to be applied can be determined substantially independent of differences between different semiconductor memory elements.

BRIEF DESCRIPTION OF THE DRAWINGS

Other and further objects and advantages of the invention will become apparent as the description thereof progresses, reference being had to the accompanying drawings wherein.

DESCRIPTION OF THE PREFERRED EMBODIMENT OF THE INVENTION

Figure 1:
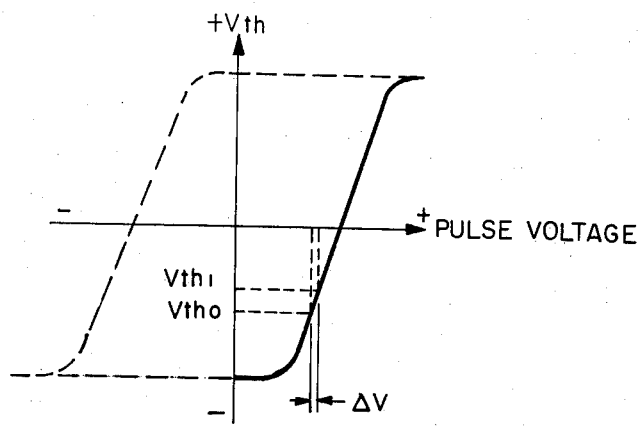
FIG. 1 is a characteristic diagram for explaining the conventional analog writing method.
Figure 2:
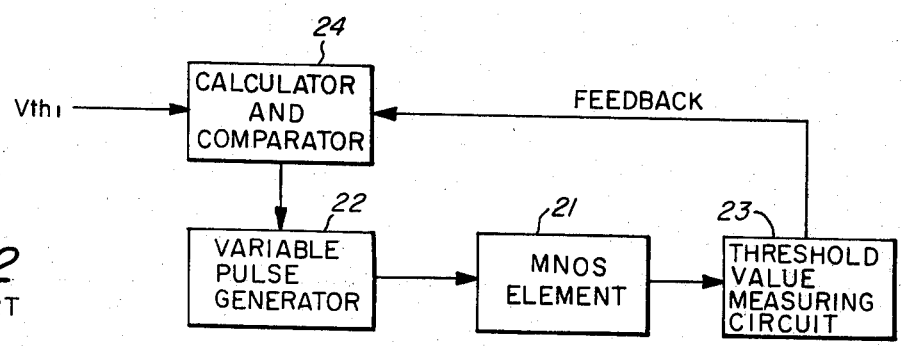
FIG. 2 is a block diagram for supplementarily explaining FIG. 1.

A conventional analog writing method is now described, referring to FIGS. 1 and 2. FIG. 1 shows an ordinary writing hysteresis curve, with the axis of abscissa showing the pulse voltage applied and the axis of ordinate the threshold voltage. FIG. 2 is a block diagram for explaining the conventional analog writing method, it corresponding to FIG. 1.

Now, in the case of storing a threshold voltage $Vthl$ in a semiconductor memory element on the basis of the above said hysteresis curve, heretofore the writing of the threshold voltage has been carried out by applying a single pulse voltage $Vg$ to the gate of the semiconductor memory element. However, the threshold voltage obtained by this type of writing method, in many cases, deviates from the predetermined value $Vthl$. The reason for this is not clear, but it appears to be due to the facts that the writing into the semiconductor memory element is not carried out in the stable or equilibrium state of the element, that the hysteresis curve varies completely depending upon the structure of the element in which to store, for example, the thickness of the extremely thin oxide layer, etc., in the case of an MNOS element, and so forth.

Also, even with the general semiconductor technique, it is extremely difficult to manufacture elements of absolutely the same structure, there always existing irregularities between the elements. That is to say, even if, for example, a plurality of semiconductor memory elements were manufactured on the same substrate under the same conditions, irregularities in characteristics between these elements and defectiveness could not be avoided.

For this reason, heretofore the writing into a semiconductor memory element has been carried out by utilizing a compensating method to be stated hereunder.

Now, the writing of a threshold value of $Vthl$ is taken as an example. First, in the case of carrying out the writing into a semiconductor memory element 21 such as an MNOS element of the like, a pulse voltage $Vg$ is applied to the gate of said element. The pulse voltage $Vg$ is generated by a variable pulse generator 22. By this pulse voltage $Vg$ applied, a threshold voltage $Vtho$ is written into the MNOS element 21. This value is measured by a threshold value measuring circuit 23, and this measured value is fed back to a calculator 24 which also acts as a comparator. The calculator 24 makes a comparison between this value $Vtho$ and the predetermined value $Vthl$, and applies a signal for generating a pulse voltage which compensates for the difference to said variable pulse generator 22. By a series of repetitive operations of this feedback loop, the threshold voltage of the semiconductor memory element can finally be made equal to $Vthl$.

As is clear even from the above explanation, in the conventional writing method, there is the disadvantage that, for the accurate threshold value writing, a feedback mechanism, a circuit for generating a variable pulse corresponding to a feedback signal, a complicated calculator, etc., are always required.

Further, the inclination of the inclined portion of the hysteresis curve illustrated in FIG. 1 is sharp, so that, if the pulse voltage applied changes even a bit, the threshold voltage written comes to change greatly, this being one of the major causes for the writing accuracy to lower.

From these points, the conventional method was disadvantageous in that the writing device becomes large-scaled and also becomes complicated in operation.

Also, the conventional method was limited in use and very inconvenient, since the writing pulse waveform must be changed each time according to the desired threshold voltages.

This invention, being one created in view of the above-mentioned points, provides a method capable of effecting in an analog manner the writing of any optional threshold value simply and with high accuracy, and is characterized in that a DC voltage corresponding to a threshold voltage to be set and an AC voltage at least the amplitude of pulse length of which is gradually attenuated are applied superposed one upon the other to the gate of an insulating gate type semiconductor memory device. By this invention, the setting of a threshold voltage of the semiconductor memory device can be carried out linearly over a fairly wide range.

This threshold value thus set was fully stable even as compared with the conventional non-volatile element.

The present invention is explained in accordance with one embodiment by using FIGS. 3 through 6. First, as the semiconductor memory device, an MNOS element is prepared. The fundamental structure of this MNOS element comprises a semiconductor substrate, i.e., silicon substrate, with a silicon dioxide layer of several tens A, for example, 20A, in thickness and a silicon nitride layer of hundreds A, for example, 500A, in thickness laminated thereon, and, further, an aluminum electrode layer which serves as a gate provided thereon. Needless to say, a source region and a drain region for read-out are provided as usual.

Next, a predetermined voltage is applied between the aluminum gate electrode layer and the silicon substrate of this MNOS element, to effect writing. In this invention, the characteristic feature is in the voltage to be applied. That is to say, as the voltage to be applied, use is made of a pulse voltage containing two components. The first component is an AC voltage the amplitude of which is gradually attenuated with the lapse of time as in waveform 10, and the second component is a DC voltage ($V_{DC}$) corresponding to the threshold voltage to be written as in voltage 12. The DC voltage ($V_{DC}$) corresponding to the threshold voltage (Vth) to be written is determined depending only upon the positive/negative amplitude ratio, etc., of the AC voltage to be stated hereinafter without depending upon the dimensions of the semiconductor memory device, for example, the thickness of the insulating material layer. It is an important characteristic feature of this invention that the voltage to be applied can be determined without depending upon the irregularities between the semiconductor memory elements.

Figure 3:
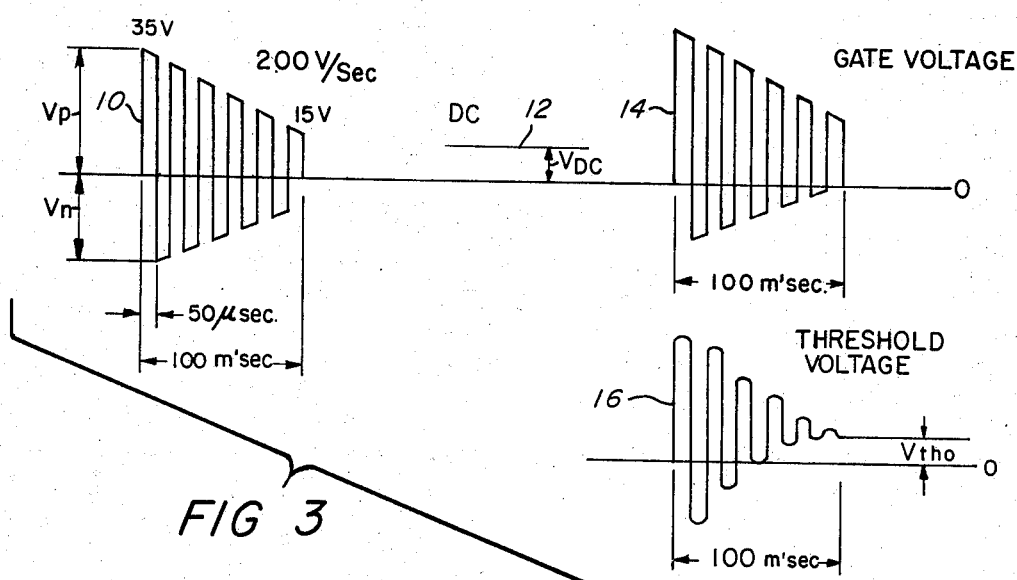
FIG. 3 is a diagram showing a gate voltage waveform to be used in one embodiment of this invention.

As shown in FIG. 3, waveform 10, the first component of a gate voltage to be applied to the gate electrode layer is an AC pulse voltage such that the initial positive peak voltage value is +35V, the absolute value of which peak voltage value is gradually decreased with the polarity of the voltage being changed alternately at intervals of 50 μsec, and, finally, the peak voltage value becomes +15V. The frequency of this AC pulse was taken as 10 KHz, and the sweeping time period as 100 msec. Also, the ratio of negative peak value to positive peak value ($Vn/Vp$) of the successive pulse was taken as variable. The second component of said gate voltage is a predetermined DC voltage 12, the amplitude of which remains unchanged, which is combined with waveform 10 to form waveform 14.

A pulse comprising the above said AC voltage waveform 10 and DC voltage 12 is applied to the gate electrode of the above-mentioned MNOS element.

Figure 4:
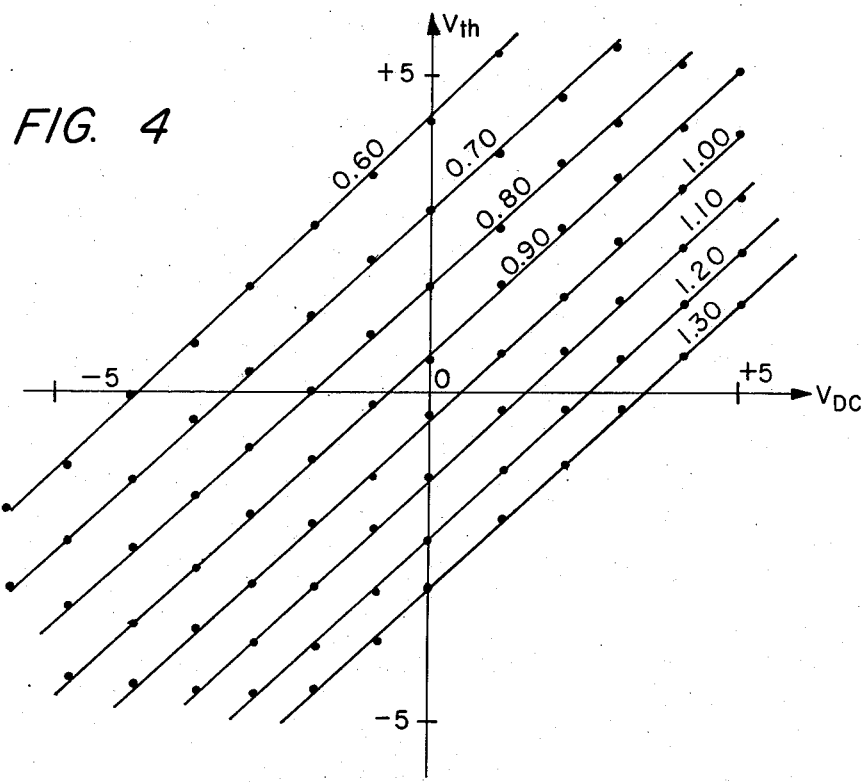
FIG. 4 is a diagram of the threshold voltage written by applying the gate voltage shown in FIG. 3 plotted against the DC voltage value.

The threshold voltage of the MNOS element written by varying the DC voltage ($V_{DC}$) with the above said ratio of negative peak value to positive peak value are as shown in FIG. 4, when variations in threshold voltage produced during writing with the waveform 14 are as shown in waveform 14 of FIG. 3. The numeral given along each straight line of FIG. 4 indicates the ratio of negative peak value to positive peak value. As shown in FIG. 4, the threshold voltage ($Vth$) varies substantially linearly with respect to the DC voltage ($V_{DC}$) between +5V and −5V. This linearity is very satisfactory without depending upon the ratio of negative peak value to positive peak value, and is one important characteristic feature which brings about advantages such that the writing method according to this invention is wide in utilization, easy to control, and so forth. Also, the generation of the AC voltage is possible with a simple device without applying a special design. It is needless to control the AC voltage generating circuit for each threshold voltage to be written; the AC voltage generating circuit may be held as it is.

Figure 5:
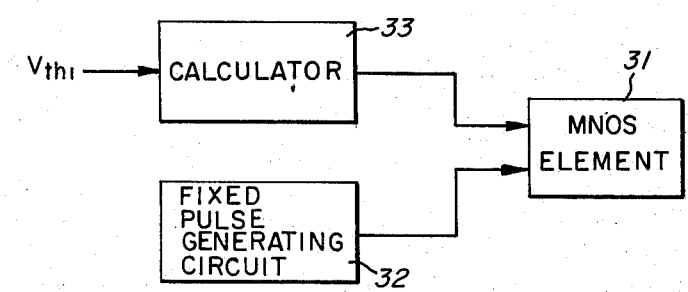
FIG. 5 is a block diagram for explaining one embodiment method of this invention.

Referring to FIG. 5, the block diagram shows the system for writing in accordance with this invention. For example, where the threshold voltage of the MNOS element 31 is taken as Vtho= +3V, if the above-mentioned ratio of negative peak value to positive peak value of the AC voltage is 1.1, it suffices if only, as the DC voltages ($V_{DC}$), +5V is superposed. This AC voltage is generated by a fixed pulse generating circuit 32. As one method, (1) a symmetrical AC pulse, that is, an AC pulse comprising an AC pulse voltage component the ratio of negative peak value to positive peak value of which is 1 and (2) a voltage component the voltage value of which drops linearly with the lapse of time are summed to generate an AC pulse. The AC pulse thus generated can thereafter be used, as it is, for writing into various semiconductor memory elements. It is one characteristic feature of this invention that, in this way, the AC pulse can be used even as it is.

Also, as it suffices only to calculate that a predetermined voltage of +5V should be added according to the above-mentioned threshold voltage, a very simple calculator 33 meets the purpose fully. In the case where there is no special need for automation, manual calculation may be effected in accordance with FIG. 4. If this is followed, then the calculator 33, too, of FIG. 4 is not required.

In this embodiment, the correlation between $V_{DC}$ and Vth was likewise examined by varying the frequency of the AC pulse to 1 KHz and 100KHz respectively, but, speaking of only the relationship between the two, it became substantially constant almost without depending upon the frequency.

Also, in the above-mentioned embodiment, an AC voltage such that the swing peak voltage was gradually decreased from +35V and stopped at +15V is shown, but the swing may be continued further from the peak voltage of +15V to bring the swing peak voltage close to zero, provided that in this embodiment it was confirmed that, in an AC voltage such that the swing was effected at a peak voltage of less than +15V and in an AC voltage such that such swing was not effected, the final threshold voltage became the same. That is to say, writing into the element used in this embodiment is not effected at a portion of the AC voltage of swing at less than +15V, so, to reduce the time of writing, it is desirable not to effect the swing at less than +15V.

Figure 6:
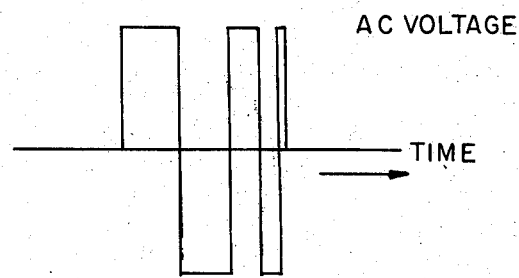
FIG. 6 is a diagram showing the waveform of an AC voltage for explaining another embodiment of this invention.

Also, in this embodiment, an example wherein the writing of a predetermined threshold value was effected by gradually attenuating the amplitude of the AC pulse is shown, but even by applying to the gate together with a DC voltage an AC pulse the pulse length of which is great at the beginning of writing and small toward the end as in FIG. 6, it is possible to carry out the writing of a predetermined threshold value with high accuracy.

From the foregoing, it is believed apparent that, according to this invention, a threshold voltage ($Vth$) to be written in a semiconductor memory device can be set at a predetermined value very simply and with high accuracy over a fairly wide Vth range, and the relationship between a DC voltage ($V_{DC}$) to be applied to a semiconductor memory device and a threshold voltage ($Vth$) to be written is linear, so that accurate control is facilitated. Also, a DC analog voltage can be used, as it is, for the setting of a threshold voltage of a semiconductor memory device, so that a complicated pulse circuit, etc., is not rerequired, and in writing a threhold value, the intended value to be set can be obtained directly without using a feedback loop. Furthermore, the correlation between $V_{DC}$ and V$th$ is linear over a wide range, so, if semiconductor memory elements such as MNOS elements, etc., are arranged in array form, the analog waveform can also be easily stored directly, this being due to the value itself of Vth being determined without depending upon the AC voltage, and use is possible of an AC pulse voltage of predetermined waveform without depending upon a threshold value to be written, so that an AC wave generating device may be a simple one, this also making possible the simultaneous writing of a threshold voltage with respect to an array of many memory transistors, the threshold voltage written by the method of this invention being fully stable in holding characteristic even as compared with a conventional semiconductor memory device.

This completes the description of the particular embodiments of the invention illustrated herein. However, many modifications thereof will be apparent to persons skilled in the art without departing from the spirit and scope of this invention. For example, other types of semiconductor devices can be used such as devices having insulating layers of other materials and other systems may be used for applying the waveform structures. In addition, the rate of change of the AC components may be nonlinear rather than linear as shown, and the time of application of the DC component and AC component need not necessarily be identical. For example, the AC component could be applied first and the DC component then superimposed. Accordingly, it is intended that this invention be not limited to the particular details of the embodiments illustrated herein except as defined by the appended claims.

What is claimed is:

1. In combination:

a semiconductor memory device comprising a semiconductor substrate, an insulating layer provided on said semiconductor substrate, an electric charge capture layer provided on said insulating layer, and an electrode layer provided on said electric charge capture layer; and means for setting any of a plurality of predetermined voltages to said electrode layer relative to said semiconductor substrate to inject an electric charge into said electric charge capture layer from said semiconductor substrate, having a unidirectional component corresponding to said threshold voltage to be set and a cyclically varying component at least the amplitude or pulse length of which is gradually diminished during a plurality of cycles of said cyclically varying component.

2. The method of storing information comprising:

forming a device having a substrate, an insulating layer on said substrate, an electric charge capture layer on said insulating layer, and an electrode layer on said electric charge capture layer; and setting a threshold voltage of said semiconductor memory device by applying a predetermined voltage to said device to inject an electric charge into said electric charge capture layer from said substrate, having a unidirectional component corresponding to said threshold voltage to be set and a cyclically varying component at least the amplitude or pulse length of which is gradually diminished with time.

3. The method in accordance with claim 2 wherein:

said substrate is a semiconductor and said insulating layer is an oxide of said semiconductor.

4. The method in accordance with claim 3 wherein:

said electric charge capture layer is a nitride of said semiconductor.

5. The method in accordance with claim 3 wherein:

said step of setting said threshold voltage comprises applying a predetermined voltage between said electrode layer and said semiconductor substrate.

6. The method in accordance with claim 2 wherein:

said unidirectional component corresponding to said threshold voltage to be set is applied for a time duration substantially equal to said cyclically varying component.

* * * * *